United States Patent [19]

Schoenmakers

[11] 4,019,091

[45] Apr. 19, 1977

[54] GAS DISCHARGE ELECTRON GUN FOR GENERATING AN ELECTRON BEAM BY MEANS OF A GLOW DISCHARGE

[75] Inventor: Theodorus Maria Berendina Schoenmakers, Eindhoven, Netherlands

[73] Assignee: U.S. Philips Corporation, New York, N.Y.

[22] Filed: Apr. 9, 1976

[21] Appl. No.: 675,498

Related U.S. Application Data

[63] Continuation of Ser. No. 575,490, May 8, 1975, abandoned.

[30] Foreign Application Priority Data

May 30, 1974 Netherlands ............... 7407253

[52] U.S. Cl. ............... 315/111.8; 219/121 EB; 313/231.5; 315/110
[51] Int. Cl.² ............... B23K 15/00; H01J 17/26
[58] Field of Search ............... 313/231, 231.5, 359, 313/362; 315/108, 110, 111.8; 219/121 P, 121 EB

[56] References Cited

UNITED STATES PATENTS

| 2,902,614 | 9/1959 | Baker | 313/362 X |
| 3,320,475 | 5/1967 | Boring | 315/108 |
| 3,454,827 | 7/1969 | Brown | 315/108 |

*Primary Examiner*—Palmer C. Demeo
*Attorney, Agent, or Firm*—Frank R. Trifari; George B. Berka

[57] ABSTRACT

A gas discharge electron gun for generating an electron beam by means of a glow discharge. A rapid control ($\approx 1$ msec) is possible by admitting the gas to the gun through at least one aperture in the inner wall of a tubular positive electrode.

5 Claims, 3 Drawing Figures

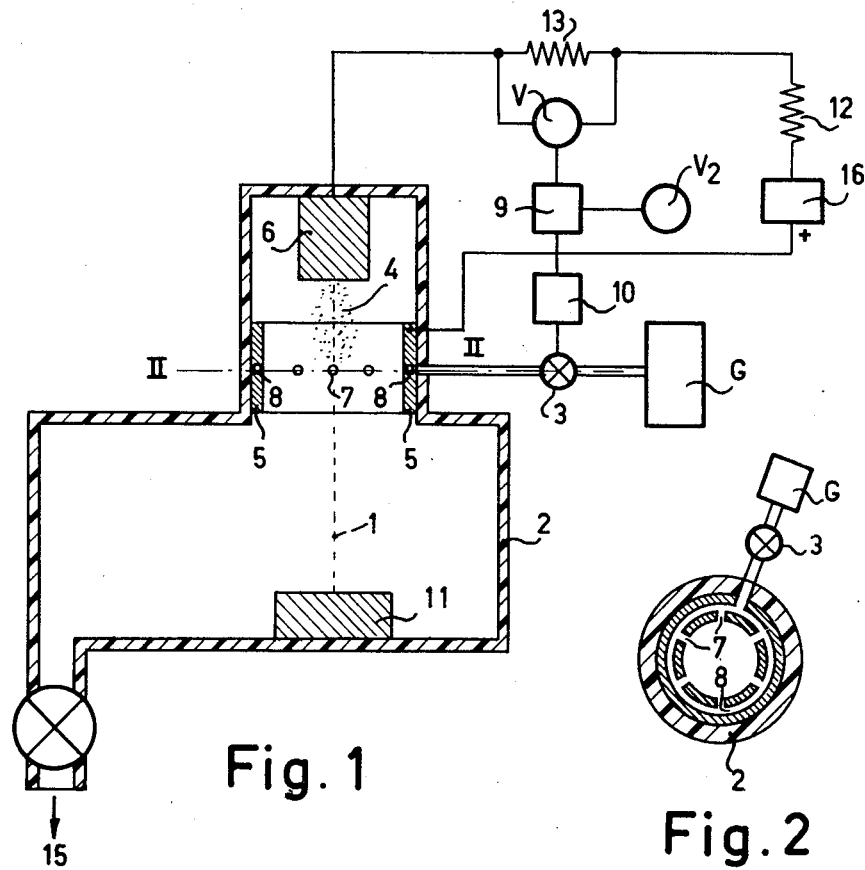
Fig. 1
Fig. 2
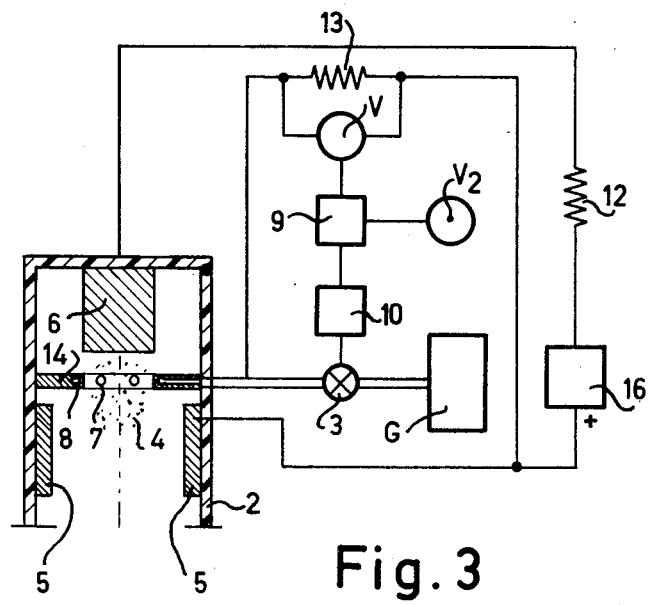
Fig. 3

GAS DISCHARGE ELECTRON GUN FOR GENERATING AN ELECTRON BEAM BY MEANS OF A GLOW DISCHARGE

This is a continuation of application Ser. No. 575,490, filed May 8. 1975, and now abandoned.

The invention relates to a gas discharge electron gun for generating an electron beam by means of a glow discharge and consisting at least of an envelope, means to maintain a gaseous ionisable medium inside said envelope, which envelope comprises an assembly of electrodes which consists at least of an anode and a cathode between which an electric voltage is applied in such manner that a glow discharge occurs in the gaseous ionisable medium between the said anode and the cathode, which glow discharge generages an electron beam, means to automatically control the pressure in the glow discharge by feeding back, via a control network, variations in one of the parameters of the glow discharge which influence the shape or intensity of the electron beam and which variations are measured via one of the electrodes of the assembly of electrodes, by providing a variation in the supplied flow of gaseous ionisable medium.

Such a gas discharge electron gun is known from the British Specification 1,065,858. In said British Patent Specification, the electrons for the electron beam are generated in the ionized medium in a perforated hollow cathode and accelerated in the direction of the workpiece. The anode in said British Patent Specification is formed by the workpiece to be worked with the electron beam and/or parts of the envelope. The pressure in the glow discharge is controlled by reaction to small variations in the electron beam intensity, measured via variations in, for example, anode current, and focusing, measured in variations in, for example, the current of a control electrode present between the anode and the cathode. Via a control network the measured variations are fed back to the pressure in the glow discharge which is adjusted by a greater or smaller supply of gaseous ionisable medium preferably in the part of the envelope in which the cathode is present. Such a system is inert because the ionizable medium has to cover a rather long track to the discharge, while the free track length of the atoms or molecules is small ($\approx 1$ mm). This has for its result that, for example in welding, large fluctuations in the pressure may occur which results in a deterioration of the energy profile in the place of welding and hence of the melt. This again results in a bad weld.

As described in the British Patent Specification 1,145,013, the anode may also have the form of a cylindrical sleeve. An advantage of this is that the workpiece, which now no longer serves as an anode, need no longer be an electrically conductive material. The control electrode may in that case also be an extra electrode which is present between the anode and the cathode.

It is the object of the invention to provide such a construction that a rapid control is made possible and in which the pressure fluctuations are minimum.

According to the invention, a gas discharge electron gun of the kind mentioned in the first paragraph is characterized in that the said anode is cylindrical and is present opposite to the cathode and the gaseous ionizable medium is admitted to the space in which the glow discharge takes place via one or more apertures in the inner wall of the electrode via which electrode the said variations are also measured. The invention is based on the recognition that the pressure variation necessary to correct the variation in one of the parameters of the glow discharge which influence the intensity or focusing of the electron beam should take place at that area where said variation is measured and not at some distance therefrom. The result of the correctionis then rapidly measured again and fed back as a result of which a rapid control is obtained. As parameters in which the variation is observed may be mentioned, for example, the discharge current (current through the glow discharge), the voltage across the discharge or across a resistor connected in series with the discharge or the voltage at or current or an electrode present between the anode and the cathode. If the control system is based on voltage measurement, building up may occur due to the ballast resistor, if same is large. Hence current measurement is to be preferred.

By causing the supply of gaseous ionizable medium to take place in the electrode, the response time is very short (approximately 1 msec.). An advantage in the case in which the anode is used as a control electrode is that the gas supply system can be operated at earth potential. The supply of gaseous ionizable medium should be carried out via a duct having a sufficiently small flow resistance to prevent a delay in the control. The control valve should also be arranged near the electrode.

The said control electrode may have the form of a cylinder, a grid or an apertured plate. The supply of gaseous ionizable medium takes place in this case via one or more apertures in the inner wall of said electrode or, in the case in which it is a grid, via one or more apertures in the ring in which said grid is secured.

The invention will now be described in greater detail with reference to the accompanying drawing, of which FIGS. 1 and 3 show diagrammatically an embodiment of the invention and FIG. 2 is a sectional view taken on the line II—II of FIG. 1.

FIG. 1 shows an embodiment of a gas discharge electron gun for generating an electron beam 1. Said gas discharge electron gun is constructed from an envelope 2 in which a given pressure is maintained (approximately 0.1 to 0.01 Torr) by means of a pump 15. Via a control valve 3 a gaseous ionizable medium is admitted from the container G to the gas discharge electron gun via the apertures in the inner wall of the anode 5. A cathode 6 is present at some distance from the anode 5. When a sufficiently large voltage difference is applied between the anode 5 and the cathode 6, for example, 10–100 KV, a glow discharge will occur between said electrodes. The ions from said glow discharge collide against the cathode 6 when same has a negative potential relative to the anode 5 and release electrons therefrom which, due to the shape of the electric field between the anode 5 and the cathode 6, are formed into an electron beam 1 with which the workpiece 11 can be worked. The voltage between the anode 5 and the cathode 6 origintaes from a supply 16 vvia a limiting resistor 12 and a measuring resistor 13. Variations in the current are established by a voltmeter V by measuring the voltage across the measuring resistor 13 and by comparison with a reference voltage $V_2$ in the comparison device 9. Via an electromechanical convertor 10 which operates the control valve 3 there is controlled back via a pressure variation in the space between the anode 5 and cathode 6. The current will regain its original value. Such variations in the voltage may arise, for example, by gas or metal vapour which is released from the workpiece 11 during the working with the electron beam 1. As a result of this the pressure in the discharge will vary and the composition of the gas in the space between the anode and the cathode varies so that a different current will start flowing through the discharge. This again influences the shape and the intensity of the electron beam and hence the quality of the working.

A very rapid (1 msec) correction is possible when some is carried out by the supply of gaseous ionisable medium via apertures 7 in the anode which are connected to a duct 8 which communicate with the container G FIG. 2 is a cross-sectional view taken on the line II—II of FIG. 1. The ionisable medium originating from the container G via the control valve is introduced into the anode via the duct 8 and the apertures 7.

FIG. 3 shows another embodiment of the gas discharge electron gun according to the invention. In this embodiment an extra electrode 14 is arranged between the anode 5 and the cathode 6 and which is used as a control electrode. Said electrode may have the form of a cylinder or a flat sheet having an aperture in the centre. Analogous to the anode 5 in FIG. 1, the inner wall of said cylinder or sheet comprises one or more apertures 7 for the supply of gaseous ionizable medium from a duct 8 which communicate with a container G. The control is carried out substantially analogously to that described with reference to FIG. 1. Said control electrode is connnected to the anode 5 via the measuring resistor 13. As a parameter which is measured may also be used the voltage across the discharge or the voltage at the control electrode.

What is claimed is:

1. A gas discharge electron gun for generating an electron beam by means of a glow discharge, comprising an envelope and, within said envelope, and electrode assbley including a cathode and at least one tubular positive electrode, means for supplying a gaseous ionizable medium into said envelope to produce the glow discharge within said electrode assembly when a voltage is applied thereto, means for measuring voltage on the electrode assembly and means for measuring pressure of the gaseous medium during the discharge, flow control means provided in said medium supplying means and coupled to said pressure measuring means and to said voltage measuring means to control the flow of the gaseous medium in response to predetermined voltage variations, the tubular electrode in said assembly including an inner duct which communicates with said supplying means and has at least one aperture interconnecting said duct with the space where the glow discharge takes place.

2. A gas discharge electron gun as claimed in claim 1, wherein the electrode with which the said pressure and voltage variations are measured is an intermediate electrode which is present between the anode and the cathode.

3. A gas discharge electron gun as claimed in claim 1, wherein the electrode with which the said voltage and pressure variations are measured is the anode.

4. A gas discharge electron gun as claimed in claim 2, wherein said intermediate electrode is a grid which is placed in a ring, said ring being provide with a plurality of apertures in the inner wall.

5. A gas discharge electron gun as claimed in claim 2, wherein said intermediate electrode is a flat sheet having a cylindrical aperture.

* * * * *